United States Patent

Naydan et al.

[15] 3,646,545

[45] Feb. 29, 1972

[54] LADDERLESS DIGITAL-TO-ANALOG CONVERTER

[72] Inventors: Bob N. Naydan, Wyckoff; John D. Brinkman, Pine Brook, both of N.J.

[73] Assignee: The Singer Company, New York, N.Y.

[22] Filed: June 4, 1970

[21] Appl. No.: 43,489

[52] U.S. Cl. ....................340/347 NT, 340/347 DA

[51] Int. Cl. ....................H03k 13/02

[58] Field of Search ........340/347, 347 NT, 347 SH, 347 CC; 235/183, 197, 154

[56] References Cited

UNITED STATES PATENTS

| | | | |
|---|---|---|---|
| 3,435,196 | 3/1969 | Schmid | 340/347 |
| 3,525,991 | 8/1970 | Kohler | 340/347 |
| 3,525,861 | 8/1970 | Alexander | 235/197 |
| 3,355,719 | 11/1967 | Fox | 235/183 |
| 3,263,186 | 7/1966 | Calcai | 340/347 SH |
| 3,070,786 | 12/1962 | MacIntyre | 340/347 |
| 3,510,770 | 5/1970 | Lowe | 340/347 CC |
| 3,541,446 | 11/1970 | Prozeller | 340/347 CC |

*Primary Examiner*—Maynard R. Wilbur
*Assistant Examiner*—Jeremiah Glassman
*Attorney*—S. A. Giarratana and Thomas W. Kennedy

[57] ABSTRACT

A charge-gated, ladderless, digital to analog (D to A) converter for converting a digital input signal into an analog output signal. The digital input signal is provided to an analog signal generating circuit, including a counter, which, upon command, generates an analog signal in the form of a pulse width which is a representation of the magnitude of the digital input signal and is a proportion of a predetermined maximum pulse width. The analog signal generating circuit includes means for applying a predetermined reference signal to the input of an integrating circuit for a period of time equal in duration to the pulse width representation of the digital input signal. The output from the integrator is received and stored upon command by storage means including a storage capacitor, to provide the analog output signal. The analog output signal is then connected to the input of the integrator for a period of time equal to the full scale integration time. In effect, when applied to the integrator, the output signal is integrated while the signal from the previous conversion remains stored on the integrator capacitor so that at the end of the integration, the signal at the integrator output is nominally equal to zero. The amount that the output signal from the integrator differs from zero at this time represents the error in the output signal of the converter and, in the subsequent conversion cycles, this error signal acts to correct the error.

15 Claims, 3 Drawing Figures

INVENTORS
BOB N. NAYDAN &
JOHN D. BRINKMAN

BY

ATTORNEY

INVENTORS
BOB N. NAYDAN &
JOHN D. BRINKMAN

BY

ATTORNEY

INVENTORS
BOB N. NAYDAN &
JOHN D. BRINKMAN

BY
ATTORNEY

LADDERLESS DIGITAL-TO-ANALOG CONVERTER

BACKGROUND OF THE INVENTION

This invention relates to a charge-gated, ladderless, D to A converter. More particularly, this invention relates to a method and apparatus for converting a digital input signal into an analog output signal using pulse width techniques.

The electronic arts are replete with circuit applications which require analog to digital (A to D) and digital to analog (D to A) conversions. In general, where electronic systems have become increasingly complex and sophisticated, it is a continuing problem in the art to provide small, reliable, and lightweight converters. In particular, the art has long sought to subminiaturize such systems wherever possible, and particularly where such converters are remotely located at terminals where subminiaturization is essential. An example of such an instance is where such converters are used in multiplexed data transmission systems to reduce system interconnection wiring and weight.

Moreover, the art has continually sought to develop satisfactory D to A converters which take advantage of the state of the art in MOS technology and a number of D to A converters which employ such technology are available. However, in general, those converters require the use of a resistive ladder network and an amplifier to implement the decoding concepts there used. These components result in a large size and a relatively high cost for the converter and often risk reliability degradation. It is possible that the ladder size, at best, may equal the size of the remaining portion of the converter, but it generally is larger depending on the fabrication process and the required accuracy. Accordingly, it is a consistent aim in the art to develop a D to A converter using MOS technology which avoids the need for a conventional resistive ladder network.

Still further, it is desired to provide a D to A converter which is not dependent upon critical components, such as precision resistors and capacitors, so that the circuit may lend itself to fabrication on a single monolithic chip. When so fabricated, the operating speeds at low power consumptions are enhanced.

In addition, it is a continuing problem in the development of D to A converters which use integrators to provide a circuit in which the analog output signal is independent of the integrator time constant variations, the output amplifier offset voltage, and any gain variations. It is also desired to avoid the need for matched components, such as pairs of resistors or capacitors, and to use circuit components having values which may have a wide tolerance variation from nominal without an adverse effect on system accuracy. Still further, and in view of the constraints described above, it is a specific aim in the art to develop a converter which performs a multibit conversion at high speeds.

Accordingly, it is an object of this invention to provide a ladderless D to A converter.

It is another object of this invention to provide a ladderless D to A converter which utilizes MOS technology and which is suitable for fabrication on a single monolithic chip.

Still more particularly, it is an object of this invention to provide a charge-gated, ladderless, D to A converter which has a 12-bit resolution at an accuracy of plus or minus 0.1 percent of full scale.

It is another object of this invention to provide a D to A converter which has a relatively low power consumption and a wide temperature range.

It is another object of this invention to provide a D to A converter which eliminates the need for a resistive ladder, matched components, or components having critical tolerances.

It is still another object of this invention to provide a D to A converter which lends itself readily to hybrid construction.

These and other objects of this invention will become apparent from a review of the description of the invention which follows taken in conjunction with the accompanying drawings.

BRIEF SUMMARY OF THE INVENTION

Directed to overcoming the problems of the prior art and to achieving a solution to the problems described above within the constraints discussed, this invention relates to a charge-gated, ladderless, D to A converter which includes means for receiving a digital input signal and means for generating an analog signal in the form of a pulse width which is a proportion of a predetermined maximum or full scale pulse width and where the pulse width is a representation of the magnitude of the digital input signal. An integrator is provided for generating an analog integrator output signal which also is a representation of the input signal. A source of reference potential is applied to the input of the integrator for a time period determined by the pulse width produced by the analog signal generating means. Upon command, the analog output from the integrator is received and stored by storage means which includes a storage capacitor. The output from the storage means provides the analog output signal of the converter circuit. This output signal is continuous and is updated in each conversion cycle. The analog output signal is also provided by a feedback circuit to the input of the integrator, upon command, for a time period equal to the full scale integration time or, in other words, the maximum pulse width of the pulse width signal.

In operation, the reference potential is first applied to the input of the integrator for a time period equal to the pulse width representing the digital input signal. At the end of this integration, the output signal of the integrator is received and stored in the storage means. The output signal from the storage means, which is the output signal of the converter, is then applied to the input of the integrator for a time period equal to the full scale integration time. The analog output signal is integrated by the integrator so that at the end of this integration the signal at the output of the integrator is nominally equal to zero. The difference of the integrator output signal at this point from zero represents the error in the output signal of the converter. The cycle is then repeated starting with the error signal on the output of the integrator. As a result when the signal on the storage means is updated, the error signal is added to the output signal in a direction to cancel the error. In this manner, in successive cycles, the error in the output signal is made to approach zero. As described, each conversion cycle thus consists of a feedback phase, a decode phase, and a data transfer or update phase.

In a second embodiment, the techniques thus described are applied to a pair of converter circuits connected in parallel. One of the pair of converter circuits provides an analog representation of the six most significant bits (MSB's) of the digital input signal while the other of the pair of converter circuits provides an analog output signal which represents the six least significant bits (LSB's) of the digital input signal. The output from the LSB converter is also provided to the input of the MSB converter for a period of time which is 1/64th ($\frac{1}{2}^6$) of the full scale integration time so that the output from the MSB converter is an accurate analog representation of the digital input signal.

DETAILED DESCRIPTION OF THE PREFERRED EMBODIMENT

Figure 1:
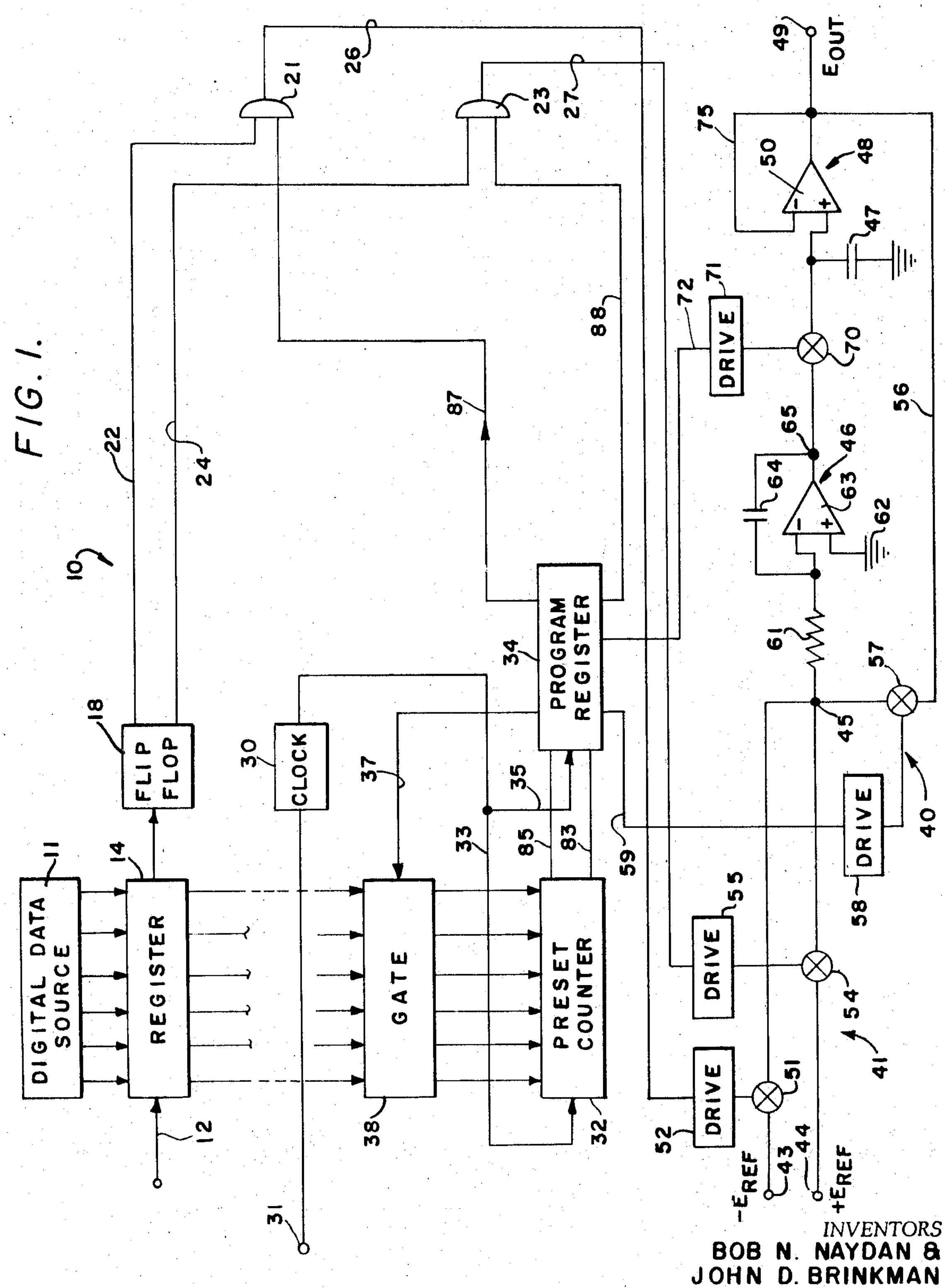
FIG. 1 is a detailed circuit diagram, substantially in block form, illustrating the D to A converter according to the invention.

In FIG. 1, the D to A converter according to the invention is designated generally by the reference numeral 10. The converter 10 includes a source 11 of digital input signals which are to be decoded into an analog output signal. The signals supplied by the signal source 11 in FIG. 1 represent a six-bit binary number provided in parallel form for storage in an input storage register 14. The storage of the binary signals from the source 11 in the register 14 is controlled by a data entry signal applied to the register 14 over input 12. The digital data is entered periodically in register 14 as it is received.

The converter 10 may be used to decode either positive or negative digital signals by sensing the polarity of the digital signal stored in the register 14 by a flip-flop 18. By using such a polarity detecting circuit, only a single six-bit storage register 14 need be used, rather than a register for each polarity. When the input signal is positive, an enabling signal is provided to a gate 21 on a lead 22. On the other hand, if the input signal is negative, an enabling signal is provided on a lead 24 from the flip-flop 18 to a gate 23. Thus, when the second input to either of the gates 21 and 23 receives a second enabling signal, an output signal will be generated therefrom on either of leads 26 and 27 respectively for use in a manner which is discussed below.

A source 30 of clock signals may be turned off and on under the control of a stop/run signal. The clock signals from the clock source 30 are provided to a six stage binary counter 32 by way of a lead 33 and to the program register 34 by way of a lead 35. The program register 34 provides a plurality of logic and timing signals for controlling the operation of the various components of the converter as is discussed in greater detail below.

A data transfer signal is provided on a lead 37 to a gate 38 which, when enabled by a signal on the lead 37, transfers the digital data from the register 14 to the binary counter 32. At the same time, the flip-flop 18 is set in accordance with the sign of the binary number in register 14.

A selectively programmable integrator input circuit designated generally at 41 selectively provides either a positive source or a negative source of reference voltage on input terminals 43 and 44 respectively to the input node 45 of an integrating circuit, designated generally by reference numeral 46.

The output signal voltage from the integrator 46 is transferred upon command by a signal from the program register 34 to a holding capacitor 47 in a storage and receiving circuit designated generally at 48. The storage circuit 48 includes an output buffer amplifier 50. The output of the buffer amplifier is provided from its output lead to the output terminal 49 which provides the analog output signal voltage of the converter 10 representing the digital input signal provided by source 11.

The source of negative reference voltage provided at terminal 43 is connected to a switch 51 in circuit with the node 45. A negative reference is required due to the inherent inversion of the integrator. Preferably, the switch 51 is an electronic switch, for example, a field effect transistor, whose switching characteristics are controlled by a drive circuit 52 which is connected to the lead 26 from the gate 21. Thus, when the gate 21 is enabled, an enabling signal is provided on the lead 26 to actuate the switch drive circuit 52 to close the switch 51. When the switch 51 is closed, the source of negative signals is provided from the terminal 43 to the node 45 to become the input to the integrating circuit 46. The length of time for which the switch 51 is closed thus determines the length of time for which the negative reference signal is applied to node 45.

Similarly, the source of positive reference signals applied to the terminal 44 is connected in circuit with a switch 54 which is also connected to the node 45. The conductivity of the switch 54 is controlled by the switch drive circuit 55 which is connected to the lead 27 from the gate 23. Thus, when the gate 23 is enabled, an enabling signal on the lead 26 actuates the switch drive circuit 55 and causes the negative reference signal at the input terminal 44 to be applied through the switch 54 to the node 45.

The analog output signal at the output terminal 49 is also provided by the lead 56 to the node 45 when the switch 57 is closed by the actuation of the switch drive circuit 58. The switch drive circuit 58 is actuated by an enabling signal on the lead 59 from the program register 34.

The signals at the node 45 are provided through an input resistor 61 to the negative terminal of an operational amplifier 63 having its positive terminal connected to a source of reference potential 62 which in the illustrated specific embodiment is ground. The operational amplifier 63 has an integrating capacitor 64 connected between its output and its negative input for providing a signal voltage at an output node 65 which is an analog representation of the integral of the signal voltage applied to the node 45.

The analog signal at the node 65 is received and stored by the holding capacitor 47 by closing the data transfer switch 70. The actuation of switch 70 is controlled by the switch drive circuit 71 which is controlled by an enabling signal from the program register 34 on the lead 72.

The output operational amplifier 50 has its output connected to the terminal 49 as previously described and includes a lead 75 directly connected from its output to its negative input terminal.

In operation, the circuit of FIG. 1 accurately decodes the digital signal from the input source 11 into an analog signal at the terminal 49 by comparing the volt time areas of the output signal and the desired digital signal. The resulting comparison is used to correct the output signal until the area difference between the two volt time areas is negligible.

In operation, assuming that a conversion cycle has just been completed so that a signal voltage representing the digital input is at node 65 which signal voltage has been transferred to capacitor 47 so that an updated signal voltage is at output terminal 49 representing the digital input, an enabling signal on the lead 37 from the program register 34 causes the digital data stored in the register 14 to be transferred to the counter 32 through the gate 38. The program register 34 also provides an enabling signal on the lead 59 to the drive circuit 58 to close the feedback switch 57. The switch 57 is closed for a time T equal to the full scale integration time, which, in the preferred embodiment, is equal to the time elapsed for $2^6$ or 64 clock pulses. The output voltage from the terminal 49 is thus integrated by the integrating circuit 46 and at the end of the cycle the output from the integrating circuit at node 65 will nominally be equal to zero. The decay of the output from the integrating circuit 46 during this integration, referred to as the feedback phase, is designated generally at the curve 80 in FIG. 2. If the output signal voltage at terminal 49 precisely equaled the output signal voltage of the integrator at node 65 at the start of this integration, then at the end of the integration the output of the integrator at node 65 will be precisely zero as indicated at 81 in FIG. 2.

In the event that there is some error, for example, due to the circuit parameters or in the amplifier 50, whereby the output signal at terminal 49 does not equal the output signal of the integrator at node 65 at the start of this integration, the output voltage of the integrator at node 65 will not be zero at 81 but will be of a value representing the error.

Figure 2:
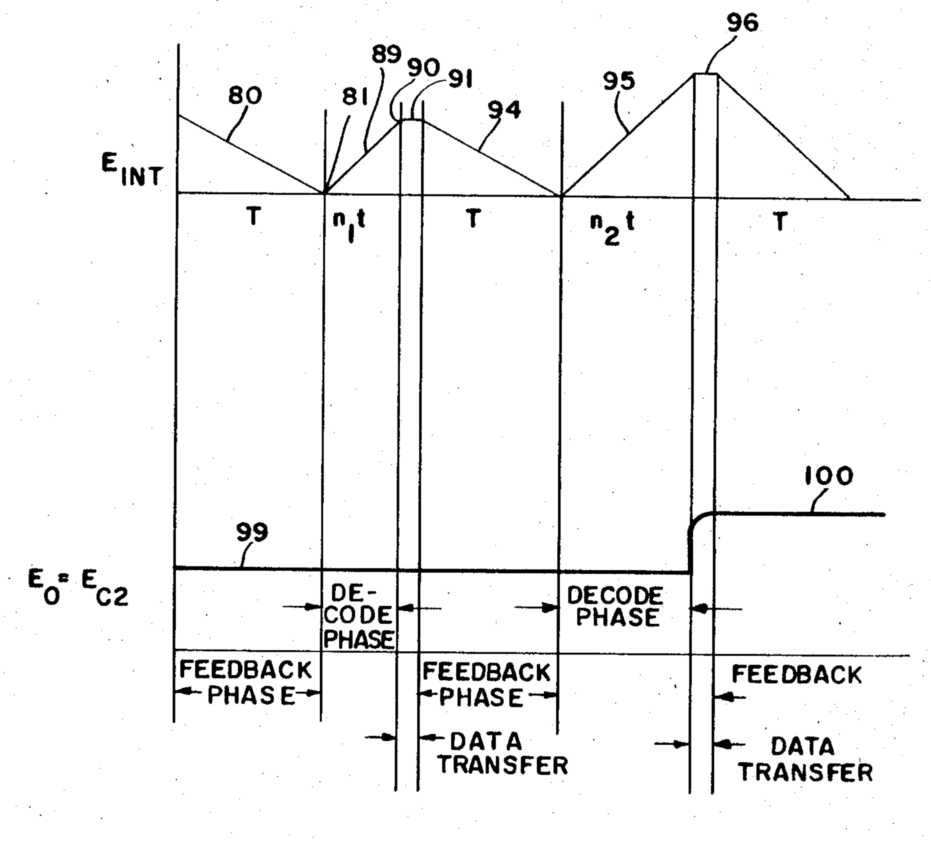
FIG. 2 is a plot of the output signal from the integrating circuit and the output signal from the converter as a function of time during several consecutive conversion cycles.

At the end of time T as designated by the point 81 in FIG. 2 the program register 34 provides a pulse on a lead 83 to the counter 32 to cause the counter to start counting pulses applied from clock 30 on the lead 31 until the number of pulses counted is equal to the digital number initially stored in the counter. When this number of pulses has been counted, this will be detected by the program register 34. By way of example, one effective technique is to store the complement of the digital data from the source 11 in the counter 32 and have the program register 34 detect when the six stage binary counter reaches a maximum count of 64. On the other hand, a down counter will serve the same purpose with the input binary number being stored as is in the counter and detecting when the count in the counter reaches zero. The program detector applies an enabling signal on leads 87 and 88 starting when the counter starts counting and ending when the counter has counted a number of clock pulses equal to the binary number initially stored in the counter. As a result the enabling signals on leads 87 and 88 have a pulse width which is proportional to the digital input which enabling signals respectively provide the second inputs to each of the gates 21 and 23 respectively.

Assuming that the digital data from source 11 is positive, the gate 21 will be enabled by a signal on lead 22 while gate 23 will be disabled since no enabling signal appeared on lead 24. Thus, when the pulse width analog signals appear on leads 87 and 88, an enabling signal is provided on the lead 26 while no enabling signal is provided on the lead 27. Thus, the switch 51 is closed so that the negative reference voltage at the terminal 44 is applied to the input node 45. The enabling signal on lead 26 will have a pulse width equal to the pulse width of the signals on leads 87 and 88 and thus will correspond to the digital input. If the digital input were negative the pulse width signal would be produced on lead 27. Since the generated analog signal on the lead 26 (or on the lead 27 for negative signals) represents the digital input, the reference voltage is applied to the input of the integrator for a variable time period which is a function of the digital input signal. Thus, the integrator output voltage at the end of the decoding cycle will represent the digital input.

The above-described decode phase is shown in FIG. 2 by the portion of the curve designated by reference numeral 89 and illustrates the output of the integrator as it rises to a level shown by the point 90, the magnitude of which is determined by the magnitude of the digital number plus or minus any error signal voltage appearing at the output of the integrator at the end of the feedback phase.

Thereafter, the output from the integrator 46 at node 65 is received by the holding capacitor 47 by closing the switch 70 in response to an enabling signal on lead 72 which is applied to the drive circuit 71. The signal transfer is shown by the portion of the curve designated at 91 in FIG. 2 at which time the output from the integrator is received and stored by capacitor 47 to provide an updated output signal on terminal 49. Thereafter, the next conversion cycle begins when the feedback switch 57 is closed and the digital data in register 14 is again transferred to the counter 32 in the manner which has been previously described.

At the end of the decode phase the output signal voltage of the integrator 63, assuming that the output signal voltage was zero at the beginning of the decode phase, will be given the following formula $E_{int}=-E_{ref}\,nt/T$ in which $E_{ref}$ is the value of the reference voltage, $n$ is the value of the digital input, $t$ is the clock pulse interval, and $T$ is the full scale integration time, or in other words the maximum pulse width of the pulse width analog signal generated in response to the digital input. Since the digital input has six bits, the value of $T$ is $2^6$ clock pulse intervals. The quantity $nt$ represents the pulse width of the pulse width signal, or in other words the integration time during the decode cycle. From the above equation, it will be apparent that if the reference voltage $-E_{ref}$ were applied for the full scale integration time $T$ during the decode cycle the output voltage of the integrator $E_{int}$ would rise from zero to $E_{ref}$. Accordingly, when the output voltage at terminal 49 is applied to the integrator during the feedback phase for the full scale integration time $T$, the output voltage of the integrator changes by an amount equal to the output voltage at terminal 49. Accordingly, at the end of the feedback phase the output voltage of the integrator will be equal to the difference between the integrator output at the end of the decode phase and the output voltage at terminal 49 and thus will represent the error between these two voltage values. Then at the end of the next decode phase this error signal voltage will be added to the voltage determined by integrating the reference voltage for the pulse width time interval determined from the digital input. Thus when the output of the integrator is transferred to the holding capacitor, the signal voltage which is transferred to the holding capacitor 47 is determined by the input digital number plus or minus the error signal voltage component which exists at the output of the integrator at the beginning of the decode phase and at the end of the feedback phase. The error signal voltage component will have a polarity to correct the error in the output signal voltage at terminal 49. When the system operates through several conversion cycles with the same digital input, the error is reduced to a negligible value by the repeated corrections in the output signal provided in the manner described above.

As may be seen in FIG. 2, a second conversion cycle includes a feedback phase during which the output of the integrator 46 at 94 decays as shown. The decode phase for the second conversion cycle is designated by the rising portion of the curve designated generally by numeral 95 and the data transfer cycle is designated by numeral 96.

The portion of the curve designated at 95 represents the decoding of a new digital number which causes the output signal designated by the analog signal output curve 98 to rise from the level designated by numeral 99 to a level designated by numeral 100 during the data transfer cycle. However, as pointed out above each digital input will normally be decoded over several conversion cycles to drive the error in the output to a negligible value.

The technique thus described minimizes the necessity for critical components, for example, the integrator capacitor 64, the holding capacitor 47, and the buffer amplifier 48 are not critical in magnitude or tolerance for the performance of the converter. Such a circuit has provided a resolution of six bits with an accuracy of plus or minus 0.1 percent of full scale. An output voltage of $\pm$ 7 volts is obtained, while the power consumption is a maximum of 300 milliwatts. The circuit also operated satisfactorily over a range from −55° to +125° C. at an altitude from sea level to 100,000 feet above sea level.

Where the conversion time is critical, the converter in the implementation shown in FIG. 1 has the disadvantage of requiring a long conversion cycle if the binary input has a large number bits such as 12 bits. The conversion time is $T+nt$ where $T$ is equal to 4,096 $t$ in a 12-bit system (since $2^{12}=4{,}096$) where $n$ is the digital number being decoded and $t$ is the interval between clock pulses. By utilizing a 50 megahertz (MHz.) clock which represents a practical upper limit for MOS circuit fabrication, the corresponding full scale conversion time would be approximately 200 microseconds, which in many applications is excessive. However, by using the technique previously described for the most significant six bits (six MSB) in conjunction an identical circuit for the least significant bits (six LSB) the desired output may be produced at an increased speed.

Figure 3:
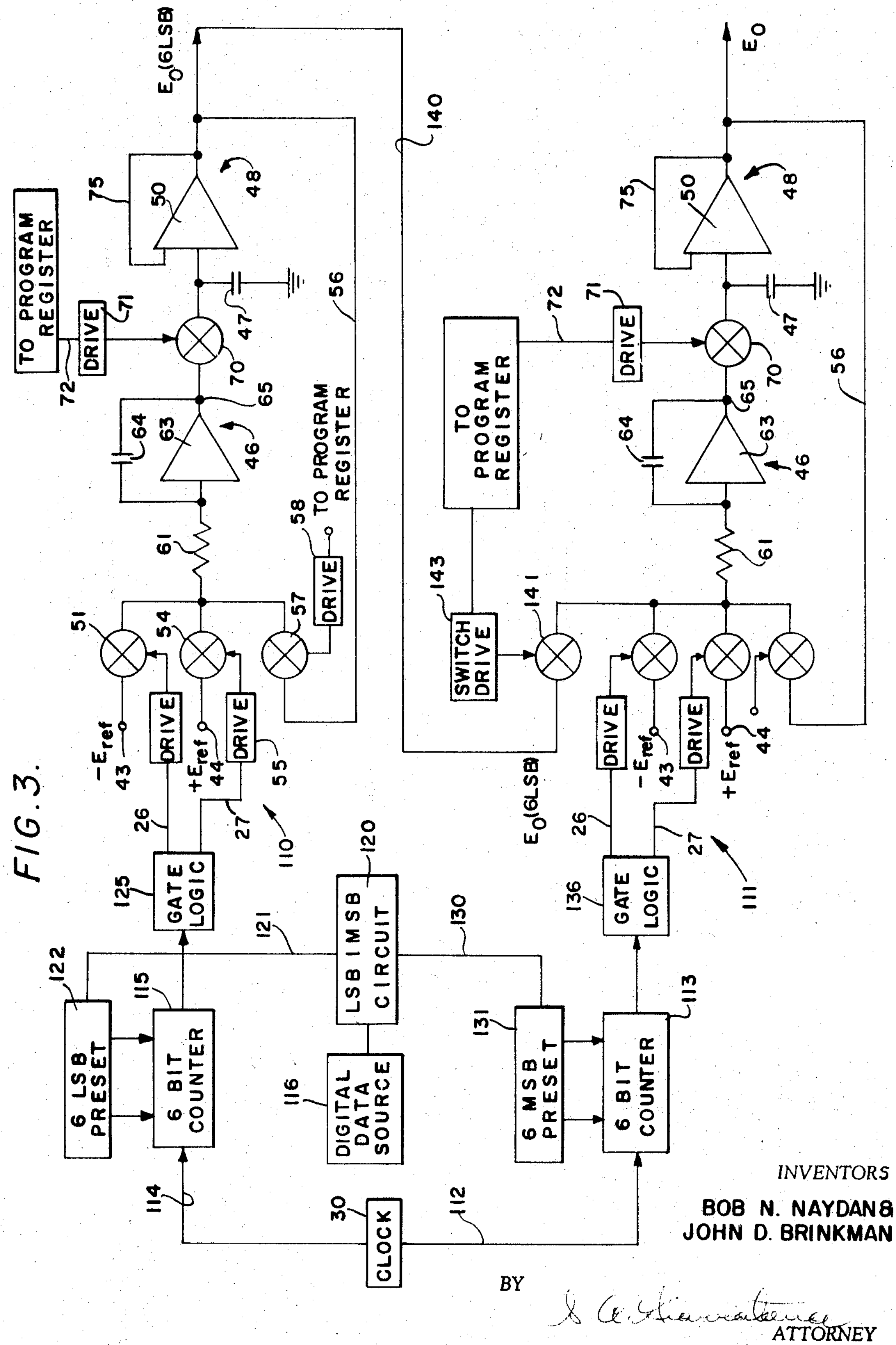
FIG. 3 illustrates a pair of D to A converters according to the invention connected in parallel to perform a pair of multibit conversions simultaneously to increase circuit speed.

The converter illustrated in FIG. 3 increases the speed of the conversion by separating the digital input data into its most significant and least significant bits. By performing conversions on each of the sets of most significant and least significant bits simultaneously in accordance with the teachings of the invention as described in FIG. 1 and then combining the outputs, the conversion speed may be materially increased. Accordingly, the D to A converter for performing the conversion on the least significant bits of the digital data, referred to as the LSB converter, is designated generally at 110, while the D to A converter for converting the most significant bits into an analog signal, referred to as the MSB converter, is shown generally at 111. For each of the converters 110 and 111, those circuit components which correspond to the components used in the converter of FIG. 1 have been designated with like reference numerals. The program register 34 has not been depicted with all of its connections, so that the circuit components which require programming for their operation in some instances have been designated generally with the designation "to program register."

In the embodiment illustrated in FIG. 3, the clock 30 provides clock signals on a lead 112 to an MSB counter 113 and on a lead 114 to an LSB counter 115. A digital signal source 116 of the type described in connection with FIG. 1 provides a 12-bit digital number to an LSB/MSB circuit 120 which divides the 12-bit number into a pair of six-bit numbers according to the six most significant bits and the six least significant bits. The least significant bits are provided on channel 121 to the six LSB preset circuit 122 which operates in a manner similar to the counter 32 in FIG. 1. The block designated generally at 125 is a gate logic circuit which represents the polarity detecting circuit as shown in FIG. 1 for providing an enabling signal or either of the leads 26 or 27 to control switches 51 or 54 respectively, as previously described.

The most significant bits are provided on channel 130 to the six most significant bit preset circuit 131 which presets the MSB counter 113. The clock designated gate logic 136 in FIG. 3 provides enabling signals on leads 26 and 27 as described above in connection with FIG. 1.

The full scale output for the six LSB conversion in the circuit 110 is only 1/64th (or $\frac{1}{2}^6$) of the full scale output from the MSB conversion performed by the converter 111. The output from the LSB converter 110 is thus provided on lead 140 to provide the input to switch 141. The switch 141 is controlled by an enabling signal from the program register. The enabling signal from the program register actuates the switch drive 143 and thus closes switch 141 for one clock period prior to transferring the data from the output of the integrator 46 to the hold capacitor 47. One clock period is $\frac{1}{2}^6$ of the full scale integration period previously described. In this manner the value of the least significant bits is added to the output of integrator 63 of the MSB converter 111 and thereby to the output signal voltage of the MSB converter 111.

The speed of the individual conversions is substantially reduced by the technique described in accordance with FIG. 3. Thus, a 10 microseconds conversion rate may be realized. The clock signal from the clock 30 is on the order of 13 MHz. as opposed to clock signals of about 50 MHz. required in 12-bit converters employing only a single integrator to obtain a 200 microsecond conversion cycle.

Thus, a digital to analog converter which eliminates the need for a conventional ladder network has been described.

The invention may be embodied in other specific forms without departing from its spirit or essential characteristics. The present embodiments are, therefore, to be considered in all respects as illustrative and not restrictive, the scope of the invention being indicated by the claims rather than by the foregoing description, and all changes which come within the meaning and range of the equivalents of the claims are therefore intended to be embraced therein.

What is claimed is:

1. A digital to analog converter for converting a digital input signal into an analog output signal comprising:
   - means for receiving a digital signal, said receiving means including means for providing a first digital signal which comprises the most significant bits of said digital signal and a second digital signal which comprises the least significant bits of said digital signal;
   - means for generating a first analog signal which is a representation of said first digital signal;
   - integrator means for generating an integrator output analog signal;
   - storage means for receiving and storing said integrator output analog signal;
   - programming means for selectively causing said first analog signal and said integrator output analog signal to be respectively connected to said integrator means for predetermined periods of time;
   - means for generating a second analog signal which is a representation of said second digital signal;
   - integrator means for generating a second integrator output analog signal;
   - storage means for receiving and storing of said second integrator output analog signal; and
   - programming means for selectively causing said second analog signal and said second integrator output analog signal to be respectively connected to said second integrator means for predetermined periods of time.

2. The converter as defined in claim 1 wherein said receiving means is a storage register.

3. The converter as defined in claim 1 wherein said generating means is further characterized as generating a first analog signal which has a pulse width which is proportional to said digital signal.

4. The converter as defined in claim 3 wherein said generating means comprises:
   - a source of clock signals;
   - a counter for receiving said digital signal; and
   - means for causing said counter to receive said clock signals until the count stored in said counter is at a predetermined count whereby the number of clock signals supplied to said counter to cause said counter to store said predetermined count determines the pulse width of said first analog signal.

5. The converter as defined in claim 3 further including a reference signal source and means for causing a reference signal from said reference signal source to be applied to said integrator means for a period of time determined by the pulse width of said first analog signal.

6. The converter as defined in claim 5 further including a second reference signal source having a polarity opposite to said first reference signal source and wherein said generating means includes circuit means for detecting the polarity of said digital signal so that either of said reference signals may be selectively applied to said integrator means to provide an integrator output analog signal which represents both the magnitude and polarity of the digital input signal.

7. The converter as defined in claim 3 wherein said program means subsequently causes a reference signal to be applied to said integrator for a period of time determined by said first analog signal, and causes said integrator output analog signal to be connected to said integrator for a predetermined period of time.

8. The converter as defined in claim 7 wherein said program means is further capable of causing the integrator output analog signal to be received by said storage means.

9. A method of converting a digital input signal into an analog output signal comprising the steps of:
   - receiving a digital input signal;
   - generating a first analog signal which is a representation of said digital signal;
   - said step of generating being further defined by the step of generating a first analog signal which has a pulse width which is a representation of the magnitude of said digital signal;
   - generating a second analog signal from an integrator which is a function of said first analog signal and said analog output signal;
   - said step of generating said second analog signal including the step of integrating a reference signal for a period of time determined by said first analog signal;
   - said step of generating said second analog signal being further defined by the step of integrating said analog output signal for a predetermined period of time;
   - said step of integrating said integrator output signal for a predetermined period of time being followed by the step of integrating said reference signal for a period of time determined by said first analog signal;
   - receiving and storing said second analog signal to provide said analog output signal; and
   - selectively causing said first analog signal and said integrator output signal to be respectively connected to said integrator for selected periods of time.

10. The method as defined in claim 9 wherein the step of receiving said digital signal includes the step of storing said digital signal.

11. The method as defined in claim 9 wherein the step of generating the first analog signal includes the step of storing said digital signal and counting a number of pulses, each of which has a predetermined width, to generate said first analog signal which is further defined as having a pulse width which is a representation of said digital signal.

12. The method as defined in claim 9 wherein the step of generating is followed by the step of receiving and storing.

13. The method as defined in claim 12 further including the step of detecting the polarity of said digital signal and selectively applying a reference signal of a given polarity.

14. The method as defined in claim 9 further including the step of generating a first digital signal which comprises the most significant bits of said digital input signal and a second digital signal which comprises the least significant bits of said digital input signal and wherein the step of generating a first analog signal is further defined in that said first analog signal is a representation of said first digital signal.

15. The method as defined in claim 14 further including the step of generating a third analog signal which is a representation of said second digital signal, generating a fourth analog signal which is a function of said first analog signal and said third analog signal, and receiving and storing said fourth analog signal to provide said analog output signal.

* * * * *